United States Patent
Kho et al.

(10) Patent No.: US 10,180,455 B2
(45) Date of Patent: Jan. 15, 2019

(54) BURN-IN TESTING OF CIRCUITS

(71) Applicant: Infineon Technologies AG, Neubiberg (DE)

(72) Inventors: Rex Kho, Holzkirchen (DE); Markus Schuemmer, Holzkitchen (DE); Human Boluki, Munich (DE)

(73) Assignee: Infineon Technologies AG, Neubiberg (DE)

( * ) Notice: Subject to any disclaimer, the term of this patent is extended or adjusted under 35 U.S.C. 154(b) by 50 days.

(21) Appl. No.: 15/601,716

(22) Filed: May 22, 2017

(65) Prior Publication Data

US 2018/0335471 A1 Nov. 22, 2018

(51) Int. Cl.
*G01R 31/28* (2006.01)

(52) U.S. Cl.
CPC .............................. *G01R 31/2875* (2013.01)

(58) Field of Classification Search
CPC ............ G01R 31/2858; G01R 31/2853; G01R 31/2882
See application file for complete search history.

(56) References Cited

U.S. PATENT DOCUMENTS

| | | | |
|---|---|---|---|
| 6,885,610 B2 | 4/2005 | Takayanagi | |
| 2001/0024384 A1* | 9/2001 | Arimoto | G11C 29/28 365/200 |
| 2004/0128574 A1* | 7/2004 | Ricci | G06F 1/3203 713/320 |
| 2008/0112524 A1* | 5/2008 | Paek | H03D 13/004 375/375 |

* cited by examiner

*Primary Examiner* — Jermele M Hollington
*Assistant Examiner* — Alvaro Fortich
(74) *Attorney, Agent, or Firm* — Shumaker & Sieffert, P.A.

(57) ABSTRACT

Circuits and methods are provided for a signal path between circuit parts. During normal operation, a delay is deactivated. During a burn-in test, the delay is activated. In the deactivated state, a delay component may be disconnected from a supply voltage.

20 Claims, 2 Drawing Sheets

BURN-IN TESTING OF CIRCUITS

TECHNICAL FIELD

The present application relates to devices and methods associated with burn-in testing of electronic circuits like semiconductors chips.

BACKGROUND

During design of electronic circuits, for example digital circuits, on a register transfer level (RTL), or also in analog circuits various process, voltage and temperature corners need to be covered to ensure reliable operation of the circuit under various conditions. One of these corners is the so-called burn-in corner. This burn-in corner is used during the manufacturing process in a so-called burn-in test, where higher voltages and temperatures compared to normal operation are applied to the circuit to stress the circuit. By such tests, so-called "early life fails" may be filtered out from produced circuits, i.e. circuits with a probability to show some kind of malfunction quite early during actual use may be detected during the burn-in test.

This burn-in corner is an artificial corner for synthesis and timing closure (as it is not used during actual use of the circuit, but only during testing) and may cause problems during timing closure. Timing closure is the process by which a circuit design is modified to meet its timing requirements, in particular as regards setup times and hold times. Generally, setup times and hold times define time windows during which a signal state has to be maintained (for example before a sampling point indicated by a clock signal and thereafter to guarantee correct sampling). In particular, because of the high voltages involved in burn-in testing (for example about 1.5 times a normal supply voltage), various timings in a circuit typically shift to a very fast corner (i.e. small delays), which may cause hold time violation problems. Conventionally, this is fixed by adding additional hold time buffers as delay elements. Such delay elements are conventionally added to timing-critical paths e.g. during timing closure. However, adding these buffers may then cause timing problems in slow process corners which may require additional modifications to also cover the situation. For example, the hold time buffers may be needed to be scaled up to also meet setup requirements in slow corners.

Therefore, covering of this burn-in corner requires additional design efforts and leads to difficulties in timing closure. Moreover, the buffers added contribute to the current consumption of the final circuit, as the area, power and timing penalty of the additional hold time buffers are present in the final design, even though the buffers may be required only to ensure correct operation during one test during the manufacturing process.

SUMMARY

According to an embodiment, a circuit is provided, comprising:
a signal path between a first circuit part and a second circuit part,
a delay component selectively activatable to add a delay to the signal path, and
a control circuit configured to activate the delay component when a supply voltage of the circuit is raised above a nominal value and to disconnect the delay component from being supplied with power when the supply voltage is at its nominal value.

According to another embodiment, a circuit is provided, comprising:
a signal path coupled between a first signal part and a second signal circuit part, wherein the signal path comprises:
an input node coupled to the first signal part,
a multiplexer, wherein the input node is coupled to a first input of the multiplexer,
a delay component, wherein the input node is coupled to an input of the delay component, wherein an output of the delay component is coupled to a second input of the multiplexer,
wherein an output of the multiplexer is coupled to the second circuit part,
wherein the circuit further comprises a control circuit configured to control the multiplexer to output a signal provided at its first input at its output during normal operation and to output a signal provided at its second input at its output during a burn-in test.

A method, comprising:
rising a supply voltage to a burn-in voltage,
activating an additional delay in a signal path when the supply voltage is at the burn-in voltage,
providing a nominal supply voltage, and
deactivating the additional delay when the nominal supply voltage is provided, wherein deactivating the additional comprises disconnecting a delay component from being supplied with power.

The above summary is merely intended to give a brief overview over some features of some embodiments and is not to be construed as limiting.

DETAILED DESCRIPTION

Figure 1:
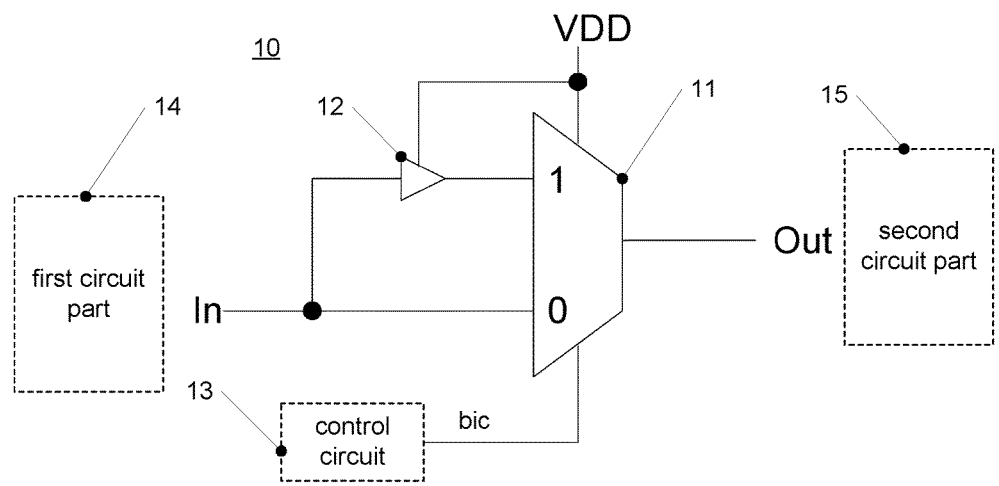
FIG. 1 is a circuit diagram of a circuit according to an embodiment.

In the following, various embodiments will be described in detail referring to the attached drawings. It is to be noted that this description is only given for illustrative purposes and is not to be construed as limiting. For example, while embodiments may be described comprising numerous features or elements, in other embodiments some of these features or elements may be omitted and/or may be replaced by alternative features or elements. Furthermore, in addition to the features or elements explicitly shown and described, other features or elements, for example features or elements used in conventional semiconductor circuit designs and/or burn-in testing of electronic circuits like semiconductor chips may be employed.

Features from different embodiments may be combined to form further embodiments. Variations and modifications described with respect to one of the embodiments may also be applicable to other embodiments.

Any direct electrical connections or couplings shown in the drawings or described herein, i.e. connections or couplings without intervening elements, may also be replaced by an indirect connection or coupling, i.e. a connection or coupling comprising one or more additional intervening elements, and vice versa as long as the general purpose and function of the connection or coupling, for example to transmit a certain kind of signal, to provide a certain delay, to transmit information or to provide a certain control, is essentially maintained. In other words, electrical connections or couplings may be modified as long as the function of the connection or coupling essentially can be maintained.

Some embodiments, as described herein, use an additional delay path which is activated during burn-in testing and deactivated otherwise. In some embodiments, deactivating the delay path comprises not providing a supply voltage to the delay path, such that in the deactivated state the delay path essentially consumes no current. In some embodiments, such an additional delay path may allow correct timing of the circuit during burn-in test, while not significantly influencing the timing of the circuit outside the burn-in test. In some implementations, this may facilitate circuit design, in particular timing closure. However, this is not limiting.

Turning now to the figures, FIG. 1 illustrates a circuit 10 according to an embodiment. Circuit 10 of FIG. 1 may be part of an electronic circuit, for example a digital circuit or analog circuit, integrated on a semiconductor chip die, or any other electronic circuit, including electronic circuits comprising discrete components. In FIG. 1, a signal is transmitted from a first circuit part 14 to a second circuit part 15. For example, first circuit part 14 may be a first digital circuit part comprising for example logic gates, transmitting a digital signal to second circuit part 15 which may be a second digital circuit part comprising for example logic gates or other digital circuits. The signal has to fulfill certain timing requirements while arriving at the second circuit part 15, for example setup and hold time requirements to be correctly sampled.

A signal derived from or being the output signal of first circuit part 14 is labelled In in FIG. 1, and a signal provided to second circuit part 15 (possibly modified by additional elements not shown in FIG. 1), is labelled Out in FIG. 1.

In the embodiment of FIG. 1, signal In is provided to a first input "0" of a multiplexer 11. Furthermore, signal In is provided to a second input "1" of multiplexer 11 via a delay component 12. Delay component 12 may be implemented as a buffer, for example as a buffer made of two inverters coupled in series. Any other conventional delay component may also be used.

Multiplexer 11 in the embodiment of FIG. 1 is controlled by a control signal bic to output selectively either the signal provided at its first input (signal In essentially without delay) or at its second input (signal In delayed by delay component 12) as output signal Out. Control signal bic may be provided by a control circuit 13 and/or may be supplied externally to the circuit.

In the embodiment of FIG. 1, delay component 12 and multiplexer 11 are supplied by a supply voltage VDD.

In an embodiment, in normal operation delay component 12 is decoupled from supply voltage VDD to prevent any leakage current, and control signal bic sets multiplexer 11 to output the signal In in undelayed form as received at its first input as signal Out. This decoupling may be done e.g. by one or more switches (not shown in FIG. 1) or by providing a separate supply to delay component 12 which is then turned off. In this way, in normal operation no delay is added, apart from possible delays caused by multiplexer 11, which in many applications may be negligible. Normal operation may be all operation outside a burn-in testing.

In some embodiments, multiplexer 11 may be designed such that when it is not supplied with a supply voltage VDD, it outputs signal In, i.e. the signal received at its first input, as signal Out. For example, in such a case multiplexer 11 may be designed as only pass-gate multiplexer. In such cases, multiplexer 11 may also be decoupled from VDD during normal operation. In some embodiments, VDD may be a supply voltage separate from a supply voltage supplying other parts of the circuit like first circuit part 14 or second circuit part 15, such that it may be disabled during normal operation. In such embodiments, also multiplexer 11 does not draw any current during normal operation.

However, during a burn-in test, the supply voltage is raised to a higher burn-in voltage typically about 1.5 the nominal supply voltage during normal operation. For example, if VDD during normal operation is 1.2 Volt, a typical burn-in voltage is 1.8 Volt. During such a burn-in, control signal bic is set to a value, for example logic 1, causing the signal delayed by delay component 12 at the second input of multiplexer 11 to be output as output signal Out. In this way, during burn-in a delay is added to compensate for the timing in the circuit being shifted to a faster corner due to the higher supply voltage at burn-in.

As in this way delay component 12 is operated only during burn-in testing, it need not be designed to also cover other process corners like a slow corner in some embodiments and may therefore be designed as a comparatively small buffer requiring comparatively little circuit area. In other words, in embodiments delay component 12 need to be designed only for the burn-in corner and does not need to cover any other corners.

In such embodiments, a previous setup time fixing during timing closure is not disturbed or only minimally disturbed by multiplexer 11 while still covering the burn-in corner.

In some embodiments, during burn-in the voltage VDD supplying multiplexer 11 is also raised to the burn-in voltage (for example raised by a factor of about 1.5), such that multiplexer 11 is included in the burn-in testing.

Figure 2:
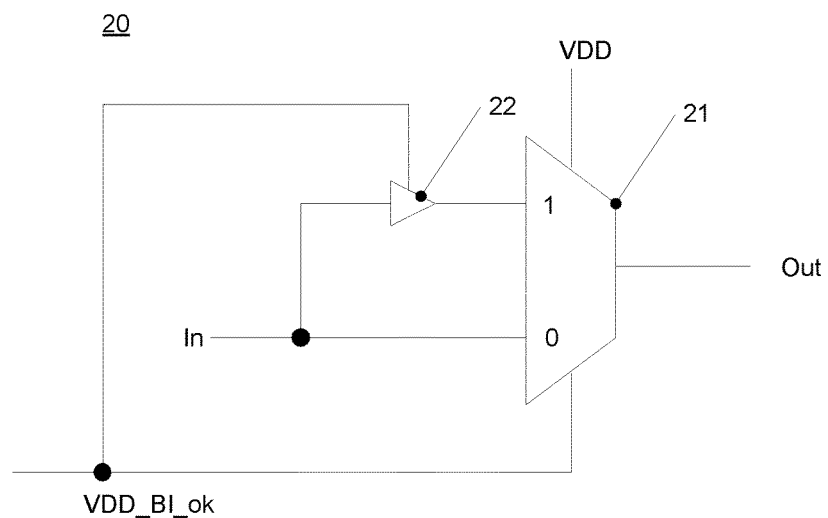
FIG. 2 is a circuit diagram of a circuit according to another embodiment.

FIG. 2 is a circuit diagram of a circuit 20 according to a further embodiment. The circuit 20 of FIG. 2 is a variation of circuit 10 of FIG. 1, and to avoid repetitions, some of the components of the circuit of FIG. 2 will be described referring to corresponding parts in FIG. 1.

Similar to circuit 10 of FIG. 1, circuit 20 of FIG. 2 serves to transmit a signal In from a first circuit part (like first circuit part 14 of FIG. 1) as a signal Out to a second circuit part (for example second circuit part 15 of FIG. 1).

Signal In is provided to a first input "0" of a multiplexer 21. Furthermore, signal In is provided to a second input "1" of multiplexer 21 via a delay component 22. Delay component 22 may be implemented as explained for delay component 12 of FIG. 1 and serves to introduce an additional delay during burn-in testing, as also explained for FIG. 1.

In the embodiment of FIG. 2, multiplexer 21 is supplied by a supply voltage VDD, which during burn-in testing is raised to a higher value, for example to 1.5 times the value during normal operation.

Multiplexer 21 is controlled by a signal VDD_BI_ok. VDD_BI_ok also supplies delay component 22. When VDD is at its normal value, VDD_BI_ok is zero, such that multiplexer 21 out-puts the undelayed signal In provided at its first input as output signal Out. Furthermore, in this case delay component 22 is not supplied with power (as VDD_BI_ok is zero), and therefore does not cause any leakage current draw.

When VDD is raised to a burn-in voltage, VDD_BI, during burn-in testing (for example raised by a factor of about 1.5), in an embodiment VDD_BI_ok also rises to the burn-in voltage. This on the one hand powers delay component 22 to delay signal In and on the other hand switches multiplexer 21 to output the signal received at its second input, i.e. signal In delayed by delay component 22, as signal Out. In this way, as already explained for FIG. 1, delay component 22 adds a delay compensating the faster operation of the circuit due to the raised supply voltage, while delay component 22 does not draw leakage current during normal operation, and circuit 20 does not essentially influence a timing closure, for example setup timing, during normal operation.

Circuits generating signal VDD_BI_ok may be implemented in various manners. For example, in some implementations, VDD_BI_ok may be coupled to VDD via a switch based on a signal indicating burn-in testing, for example using a transistor switch, while being pulled to ground otherwise. In other embodiments, a detection circuit may be used to detect the voltage VDD rising for burn-in and then generating signal VDD_BI_ok accordingly. A non-limiting example for such a detection circuit is shown in FIG. 3.

Figure 3:
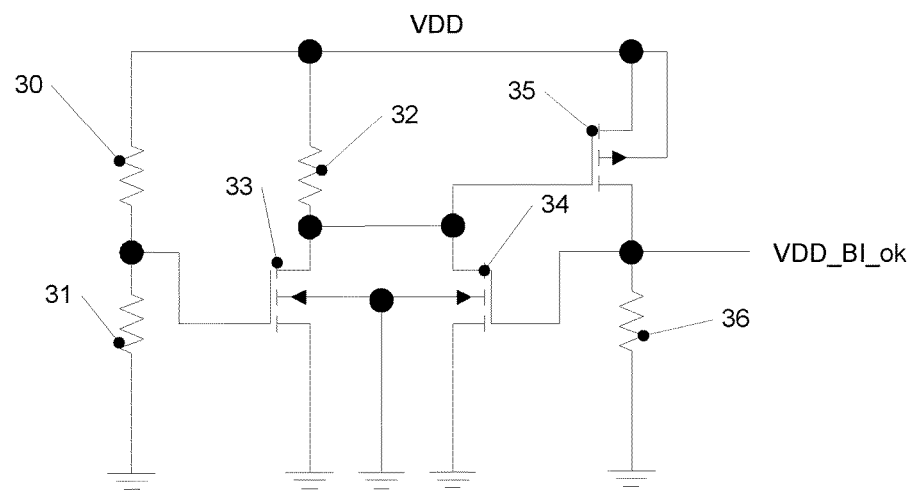
FIG. 3 is a circuit diagram of a control circuit according to an embodiment.

The example circuit comprises resistors 30, 31, 32, 36 and transistors 33, 34, 35 coupled between VDD and ground as shown in FIG. 3. Signal VDD_BI_ok is tapped at a node between transistor 35 and resistor 36. The circuit of FIG. 3 essentially is a Schmitt trigger to detect when VDD rises above a certain level, for example exceeds 1.3 times a nominal value VDD or any other threshold value between the nominal value and a value used for burn-in testing. The threshold may be set by a ratio of resistors 30 and 31, which form a resistive divider.

For voltages below the threshold, transistor 35 is non-conducting, and resistor 36 pulls VDD_BI_ok to ground. This corresponds to the situation during normal operation.

When VDD rises above the threshold when VDD is raised to the burn-in voltage, transistor 35 becomes conducting pulling VDD_BI_ok to VDD (in case of burn-in testing therefore to the burn-in voltage). Therefore, the circuit of FIG. 3 is also an example how the functionality of VDD_BI_ok described with respect to FIG. 2 may be obtained, i.e. VDD_BI_ok being zero (corresponding to ground) in normal operation when VDD at its nominal value and rising to the increased voltage VDD during burn-in testing when burn-in testing is performed.

Apart from the differences explained above, operation of circuit 20 of FIG. 2 may correspond to the operation of circuit 10 of FIG. 1, and the explanations made with respect to circuit 10 may also apply to circuit 20 of FIG. 2.

In some embodiments, connecting delay component 22 and the control signal of multiplexer 11 to VDD_BI_ok (i.e. a voltage) avoids having to make late register transfer level (RTL)changes during hold-time fixing in a design process. As it is not previously known where hold time buffers will be implemented during hold time fixing, by supplying delay component 22 and controlling multiplexer 11 by VDD_BI_ok, no late RTL changes may be necessary in some embodiments. When the circuit of FIG. 2 is implemented during hold-time fixing, an alternate voltage VDD_BI_ok is connected to the appropriate port of the new Burn-in Cell. In and Out are connected to the path to be delayed, and the RTL remains functionally the same. A library cell for FIG. 2 will just have an additional delay value for when the VDD_BI_ok=VDDnom * Burn-in Factor (1.5 in this embodiment, VDDnom being the supply voltage during normal operation.

It should be noted that circuits 10 or 20 as shown in FIG. 1 or 2 may be applied to a plurality of signal paths in an electronic circuit like a chip. Furthermore, in case a control circuit like the one shown in FIG. 3 is used, in some implementations such a circuit may be provided only once and supply a plurality of circuits 20 in a plurality of signal paths with signal VDD_Bi_ok. In other words, a single control circuit may be provided for a plurality of signal paths.

Figure 4:
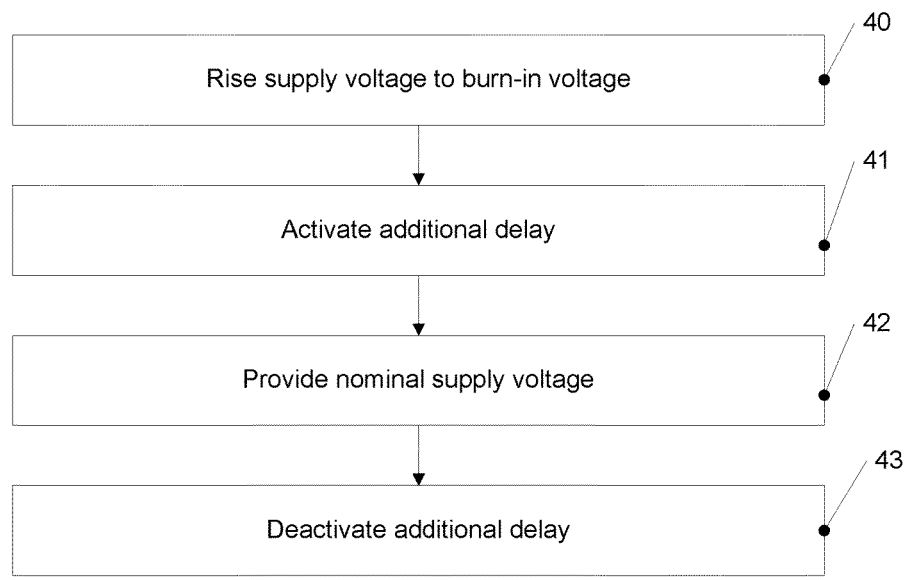
FIG. 4 is a flow chart illustrating a method according to an embodiment.

FIG. 4 is a flowchart illustrating a method according to an embodiment. While the method of FIG. 4 is shown and will be described as a series of acts or events, the order in which these acts or events are described and shown is not to be construed as limiting. In particular, in other embodiments the order of acts or events may differ from the one shown.

For ease of illustration, the method of FIG. 4 will be described referring to the circuits discussed with reference to FIGS. 1-3. However, the circuits of FIGS. 1-3 are merely an example how to implement the method of FIG. 4, and the method of FIG. 4 may also he applied to other circuit.

At 40 in FIG. 4, the method comprises rising a supply voltage of an electronic circuit to a burn-in voltage for burn-in testing. At 41, the method comprises activating at least one additional delay in at least one circuit path of the circuit in response to or simultaneously to rising the supply voltage. The additional delay may compensate for the circuit moving to a faster process corner due to the supply voltage being raised.

At 42, the method comprises providing a normal operation voltage, for example during other testing of the circuit or during normal operation of the circuit. When the normal operation voltage is provided as supply voltage, at 43 the additional delay is deactivated. In embodiments, deactivating the additional delay comprises disconnecting a delay component from a power supply, for example as explained with reference to FIGS. 1-3, such that the delay component in normal operation does not draw leakage current. In some embodiments, additionally a multiplexer used for activating and deactivating the additional delay may also be disconnected from power when the normal operation voltage is provided, as explained above referring to FIG. 1.

Example 1. A circuit, comprising:
  a signal path between a first circuit part and a second circuit part,
  a delay component selectively activatable to add a delay to the signal path, and
  a control circuit configured to activate the delay component when a supply voltage of the circuit is raised above a nominal value and to disconnect the delay component from being supplied with power when the supply voltage is at its nominal value.

Example 2. The circuit of example 1 or 2, wherein the control circuit is configured to activate the delay component when the supply voltage rises to a burn-in voltage.

Example 3. The circuit of example 1, wherein the delay component comprises at least one of a buffer or an inverter.

Example 4. The device of any one of examples 1-3, further comprising a multiplexer to selectively activate the delay component.

Example 5. The device of example 4, wherein the delay component is powered by a control signal of the multiplexer.

Example 6. The device of example 5, wherein the control circuit is configured to set the control signal of the multiplexer to the supply voltage when the supply voltage exceeds a threshold value above the nominal value and to set the control signal to ground when the supply voltage is at its nominal value.

Example 7. The device of example 6, wherein the control circuit comprises a Schmitt trigger.

Example 8. The device of any one of examples 4-7, wherein the control circuit is configured to disconnect the multiplexer from the supply voltage when the supply voltage is at its nominal value.

Example 9. The circuit of any one of examples 1-8, wherein the at least one of the first or second signal parts is a digital signal part.

Example 10. A circuit, comprising: a signal path coupled between a first signal part and a second signal circuit part, wherein the signal path comprises:
 an input node coupled to the first signal part, a multiplexer, wherein the input node is coupled to a first input of the multiplexer,
 a delay component, wherein the input node is coupled to an input of the delay component, wherein an output of the delay component is coupled to a second input of the multiplexer,
  wherein an output of the multiplexer is coupled to the second circuit part,
  wherein the circuit further comprises a control circuit configured to control the multiplexer to output a signal provided at its first input at its output during normal operation and to output a signal provided at its second input at its output during a burn-in test.

Example 11. The circuit of example 10, wherein the delay component is configured to be disconnected from a supply voltage during normal operation and connected to a supply voltage during burn-in test.

Example 12. The circuit of example 10 or 11, wherein a control input of the multiplexer is coupled to a supply input of the delay component.

Example 13. The circuit of example 12, wherein the control circuit comprises a voltage detection circuit configured to provide a supply voltage to the control input of the multiplexer when the supply voltage exceeds a threshold value above a nominal voltage and to provide a ground voltage value to the control input when the supply voltage is at its nominal value.

Example 14. The circuit of example 13, wherein the control circuit comprises a Schmitt trigger.

Example 15. A method, comprising:
 rising a supply voltage to a burn-in voltage,
 activating an additional delay in a signal path when the supply voltage is at the burn-in voltage,
 providing a nominal supply voltage, and
 deactivating the additional delay when the nominal supply voltage is provided, wherein deactivating the additional comprises disconnecting a delay component from being supplied with power.

Example 16. The method of example 15, wherein activating the additional delay comprises controlling a multiplexer.

Example 17. The method of example 16, wherein controlling the multiplexer comprises providing a voltage both as control signal to the multiplexer and as supply voltage to the delay component.

Example 18. The method of any one of examples 15-17, wherein the deactivated additional delay essentially does not affect timing of a circuit including the signal path.

Example 19. The method of any one of examples 15-18, wherein activating and deactivating the additional delay comprises activating and deactivating the additional delay based on detecting the supply voltage exceeding a threshold value.

Example 20. The method of any one of examples 15-19, wherein the delay component comprises at least one of a buffer or an inverter.

While a plurality of embodiments have been discussed above, as evident from the variations and modifications discussed, these embodiments are not to be construed as limiting in any way.

What is claimed is:

1. A circuit, comprising:
 a signal path between a first circuit part and a second circuit part,
 a delay component selectively activatable to add a delay to the signal path, and
 a control circuit configured to activate the delay component when a supply voltage of the circuit is raised above a nominal value and to disconnect the delay component from being supplied with power when the supply voltage is at its nominal value.

2. The circuit of claim 1, wherein the control circuit is configured to activate the delay component when the supply voltage rises to a burn-in voltage.

3. The circuit of claim 1, wherein the delay component comprises at least one of a buffer or an inverter.

4. The device of claim 1, further comprising a multiplexer to selectively activate the delay component.

5. The device of claim 4, wherein the delay component is powered by a control signal of the multiplexer.

6. The device of claim 5, wherein the control circuit is configured to set the control signal of the multiplexer to the supply voltage when the supply voltage exceeds a threshold value above the nominal value and to set the control signal to ground when the supply voltage is at its nominal value.

7. The device of claim 6, wherein the control circuit comprises a Schmitt trigger.

8. The device of claim 4, wherein the control circuit is configured to disconnect the multiplexer from the supply voltage when the supply voltage is at its nominal value.

9. The circuit of claim 1, wherein the at least one of the first or second signal parts is a digital signal part.

10. A circuit, comprising:
 a signal path coupled between a first signal part and a second signal circuit part, wherein the signal path comprises:
  an input node coupled to the first signal part, a multiplexer, wherein the input node is coupled to a first input of the multiplexer,
  a delay component, wherein the input node is coupled to an input of the delay component, wherein an output of the delay component is coupled to a second input of the multiplexer,
  wherein an output of the multiplexer is coupled to the second circuit part,
 wherein the circuit further comprises control circuit configured to control the multiplexer to output a signal provided at its first input at its output during normal operation and to output a signal provided at its second input at its output during a burn-in test.

11. The circuit of claim 10, wherein the delay component is configured to be disconnected from a supply voltage during normal operation and connected to a supply voltage during burn-in test.

12. The circuit of claim 10, wherein a control input of the multiplexer is coupled to a supply input of the delay component.

13. The circuit of claim 12, wherein the control circuit comprises a voltage detection circuit configured to provide a supply voltage to the control input of the multiplexer when the supply voltage exceeds a threshold value above a nominal voltage and to provide a ground voltage value to the control input when the supply voltage is at its nominal value.

14. The circuit of claim 13, wherein the control circuit comprises a Schmitt trigger.

15. A method, comprising:
rising a supply voltage to a burn-in voltage,
activating an additional delay in a signal path when the supply voltage is at the burn-in voltage,
providing a nominal supply voltage, and
deactivating the additional delay when the nominal supply voltage is provided, wherein deactivating the additional comprises disconnecting a delay component from being supplied with power.

16. The method of claim 15, wherein activating the additional delay comprises controlling a multiplexer.

17. The method of claim 16, wherein controlling the multiplexer comprises providing a voltage both as control signal to the multiplexer and as supply voltage to the delay component.

18. The method of claim 15, wherein the deactivated additional delay essentially does not affect timing of a circuit including the signal path.

19. The method of claim 15, wherein activating and deactivating the additional delay comprises activating and deactivating the additional delay based on detecting the supply voltage exceeding a threshold value.

20. The method of claim 15, wherein the delay component comprises at least one of a buffer or an inverter.

* * * * *